(12) United States Patent
Yazzie et al.

(10) Patent No.: US 10,290,569 B2
(45) Date of Patent: May 14, 2019

(54) CONSTRAINED CURE COMPONENT ATTACH PROCESS FOR IMPROVED IC PACKAGE WARPAGE CONTROL

(71) Applicant: Intel Corporation, Santa Clara, CA (US)

(72) Inventors: Kyle Yazzie, Chandler, AZ (US); Venkata Suresh R. Guthikonda, Chandler, AZ (US); Patrick Nardi, Scottsdale, AZ (US); Santosh Sankarasubramanian, Chandler, AZ (US); Kevin Y. Lin, Chandler, AZ (US); Leigh M. Tribolet, Chandler, AZ (US); John L. Harper, Chandler, AZ (US); Pramod Malatkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,707

(22) Filed: Sep. 29, 2017

(65) Prior Publication Data

US 2019/0103345 A1    Apr. 4, 2019

(51) Int. Cl.
| | |
|---|---|
| *H01L 23/49* | (2006.01) |
| *H01L 23/498* | (2006.01) |
| *H01L 23/367* | (2006.01) |
| *H01L 21/50* | (2006.01) |
| *H05K 1/02* | (2006.01) |
| *H01L 23/00* | (2006.01) |
| *H01L 23/52* | (2006.01) |

(52) U.S. Cl.
CPC ........ *H01L 23/49816* (2013.01); *H01L 21/50* (2013.01); *H01L 23/3675* (2013.01); *H01L 23/52* (2013.01); *H01L 24/14* (2013.01); *H01L 24/81* (2013.01); *H05K 1/0271* (2013.01)

(58) Field of Classification Search
CPC ............... H01L 23/49; H01L 23/49816; H01L 23/49838; H01L 21/56; H01L 21/60
See application file for complete search history.

(56) References Cited

U.S. PATENT DOCUMENTS

| | | | |
|---|---|---|---|
| 2015/0060114 A1* | 3/2015 | Park ..................... | H05K 3/4691 174/254 |
| 2017/0029311 A1* | 2/2017 | Brockmeier .......... | C03B 11/082 |

* cited by examiner

*Primary Examiner* — Phuc T Dang
(74) *Attorney, Agent, or Firm* — Green, Howard & Mughal LLP

(57) ABSTRACT

An apparatus, comprising a first platform comprising a first working surface having a first non-planar portion; and a second platform comprising a second working surface having a second non-planar portion, wherein: the second working surface is opposite the first working surface, a distance between the first working surface and the second working surface is adjustable, the first non-planar portion comprises a first curved portion, and the second non-planar portion comprises a second curved portion opposite the first curved portion.

15 Claims, 7 Drawing Sheets

US 10,290,569 B2

CONSTRAINED CURE COMPONENT ATTACH PROCESS FOR IMPROVED IC PACKAGE WARPAGE CONTROL

BACKGROUND

Packaging for microelectronic devices is facing increasing demand for smaller dimensions. This trend is driven by consumer demand for increasing portability of computing devices such as smart phones and laptops. Currently, there is an industry-wide trend to reduce Integrated Circuit (IC) package dimensions to accommodate the trend for ultrathin high performance smart phones, where IC package thickness, as well as footprint, is reduced without impacting device performance. However, increasingly thinner packages are subject to high warpage, drastically impacting yield.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
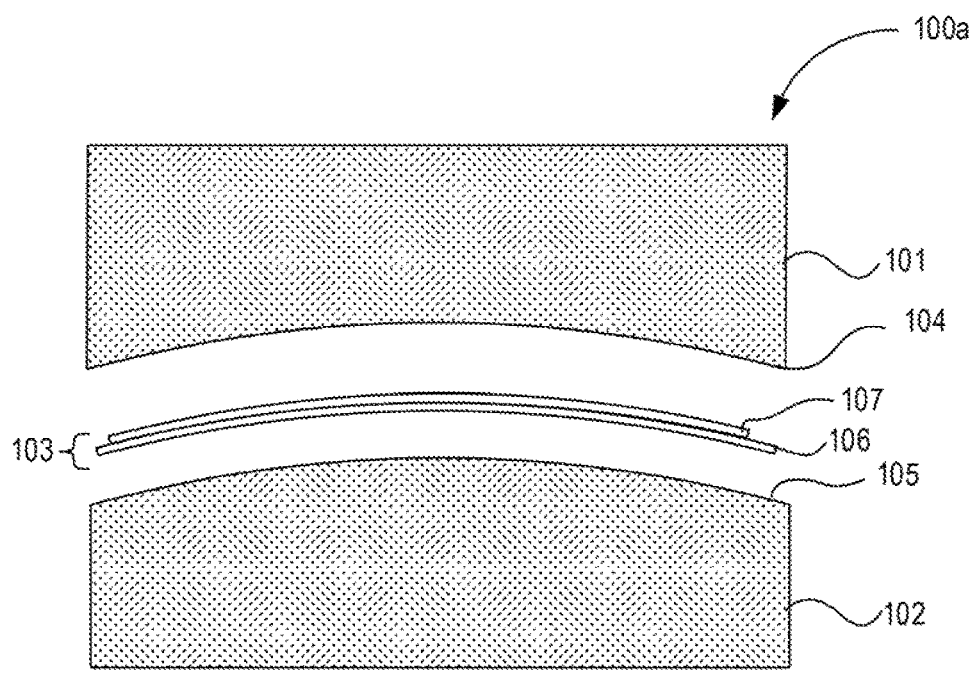
FIG. 1A illustrates a profile view of a constrained IC package assembly (CPA) bonding tool, according to some embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Here, the term "die" generally refers to a chip, or portion of semiconductor or insulator substrate supporting at least one integrated circuit (IC). The die is cut, or diced, usually as multiple copies, from a processed substrate wafer. The die must be packaged for access to the circuitry integrated on the die.

Here, the term "IC package" generally refers to a self-contained carrier of one or more dies, where the dies are attached to the IC package substrate, and encapsulated for protection, with integrated or wire-boned interconnects between the die(s) and leads, pins or bumps located on the external portions of the IC package substrate. The IC package may contain a single die, or multiple dies, providing a specific function. The IC package is usually mounted on a printed circuit board for interconnection with other packaged ICs and discrete components, forming a larger circuit.

Here, the term "stiffener" generally refers to a stiff metal plate or frame attached to a IC package substrate to mitigate bending and warpage of the IC package substrate that may occur during manufacture.

Here, the term "warpage" generally refers to a strain-induced non-planarity or curvature of an IC package that may occur during or after assembly. The IC package bows into a concave or convex profile, where "convex" is generally defined as bowing of the IC package substrate upward, or toward an attached die and/or stiffener, and where "concave" is generally defined as bowing of the IC package downward, or away from an attached die and/or stiffener.

Here, the term "thermal compression bonding" generally refers to a manufacturing method for IC package assembly by tooling that applies heat and pressure to bond together IC package components such as dies, lead frames and stiffeners. Heat may be applied for solder reflow and/or adhesive curing. The tooling may simultaneously apply force to press the components together as a stack, typically dies, heat spreaders, interposers, stiffeners and/or lead frames on a IC package substrate. The pressure may be applied during the heating cycle to increase contact between bonding surfaces, ensuring reliability of the finished IC package.

As an IC package thickness is reduced, the IC package is subject to warpage due to temperature-induced strain on IC package components. Much of the strain results from a coefficient of thermal expansion (CTE) mismatch between materials of the IC package components when subject to thermal cycling. An example of thermal cycling during IC package assembly is solder reflow, where packages are subjected to temperature excursions up to 260° C. for several minutes. Other thermal cycling involves adhesive curing, where epoxy adhesives may be used for attachment of IC package components such as integrated heat spreaders and lead frames to the IC package substrate.

In current IC package assembly processes, the adhesive bonding of certain components is typically performed in a thermocompression bonding (TCB) tool, where the TCB tool keeps the substrate and stiffener substantially flat during thermal cycling. TCB tools generally comprise two platens, with temperature control applied to one or both platens. The workpiece, which here is the partially assembled IC package, is compressed and held flat between the platens during a heating cycle, where a controlled force is applied to one or both platens. The temperature cycle is generally optimized for curing adhesives used in bonding components to a IC package substrate, or to other components. Conventional TCB tool platens are typically thick steel plates, and have flat work surfaces for even application of heat and pressure to the workpiece. Force is applied to press and hold IC package components together to assure good bonding while holding the IC package and attached components substantially flat.

After cooling of the IC package, measurable room temperature warpage may be observed due to CTE mismatch of bonded IC package components. Compressive and tensile strain may be present within the packages substrate, causing the convex bowing (e.g., compressive strain) or concave bowing (e.g., tensile strain).

To counteract warpage, a stiffener may be included in the IC package assembly by attachment to the substrate. The role of the stiffener is to constrain the IC package to be reasonably flat by countering thermally-induced strain in the IC package substrate. Stiffeners, which are typically high modulus metal plates or frames, are often adhesive-bonded at high temperatures (e.g., approximately 160° C.) in a TCB tool to a IC package substrate before or after die attachment, to reduce warpage and balance the distribution of CTE in the IC package. The IC package and stiffener are held flat during the thermocompression bonding.

The CTE and modulus of the stiffener may be optimized for compatibility with a particular IC package. Dimensions are chosen to be compatible with the IC package x-y footprint. As the latter (IC package x-y dimensions) become smaller to meet consumer demand for more compact mobile devices, there is less IC package substrate surface to which a stiffener may be bonded. Therefore, for the stiffener to be effective in controlling IC package warpage, the stiffener may be made thicker to compensate for the smaller bonding area. The requirement for thicker stiffeners to compensate for smaller IC package footprint is antithetical to the effort to produce thinner packages.

Often, a stiffener is optimized to reduce warpage at room temperature, for instance, after adhesion of IC package an integrated heat spreader. Warpage may be apparent again, for instance, when the IC package is thermally cycled to higher temperatures for further processing. Another example is when a finished IC package is soldered to a printed circuit board in a SMT reflow oven, where reflow temperatures can peak at 260° C. Warpage may be critical during this stage, as bowing of the IC package substrate can be several hundred microns to a millimeter out-of-plane.

Described herein is a IC package assembly tool and method and for controlling and optimizing IC package warpage that does not require the need for thick stiffeners, in accordance with some embodiments. Embodiments of the IC package assembly tool, herein referred to as a constrained IC package attach (CPA) tool, and a method for attaching components to a workpiece comprising a IC package substrate. The CPA tool has non-planar working surfaces that are engineered to hold a workpiece into a constrained out-of-plane shape during thermal cycling, in contrast to conventional thermocompression bonding (TCB) heads that have substantially flat working surfaces for holding a workpiece in a nominally flat shape. The direction of bowing may be convex or concave. The workpiece is constrained into an out-of-plane bowed shape in the CPA tool and is held in the constrained shape during temperature cycling to introduce a predetermined, or engineered warpage into the IC package. The predetermined warpage that is introduced to the IC package substrate and attached components counteracts the natural warpage that a conventionally assembled IC package may exhibit at certain temperatures. The direction of the predetermined warpage may be convex to negate a natural concave warpage. The magnitude of the introduced warpage may be predetermined by empirical methods to result in a zero warpage, or substantially flat geometry, at a specific temperature range.

As an example, during a stiffener attach operation, the stiffener and substrate are constrained to bow into a specific warpage in a CPA tool. The warpage is predetermined to negate natural warpage that the IC package exhibits would otherwise exhibit at room temperature, or at higher temperatures, if held flat the during stiffener attach operation. The stiffener adhesive is cured and hardened during temperature cycling, causing the IC package to retain the warpage after removal from the CPA tool.

The magnitude and direction of the introduced warpage is in general temperature dependent. In some embodiments, the magnitude of the introduced warpage is optimized to be substantially zero at ambient temperatures (e.g., room temperature, 25° C.), and non-zero at higher temperatures. In some embodiments, the magnitude of the introduced warpage is optimized to be substantially zero at solder reflow temperatures (e.g., 220° C. to 260° C.), and non-zero at lower temperatures (e.g., 25° C.). In this case, the IC package relaxes from the room temperature warpage to a flat geometry (substantially zero warpage) at solder reflow temperatures. For downstream device assembly, the substantially zero warpage at solder reflow temperatures is advantageous. For example, the reliability of solder joints is increased during attachment of a ball grid array (BGA) IC package to a circuit board when the IC package relaxes from a warped geometry at room temperatures to a flat geometry during the solder reflow process.

In some embodiments, the introduced warpage is optimized to negate natural warpage that occurs any temperature between room temperatures (approximately 25° C.) to solder reflow temperatures (220° C.-260° C.). The introduced warpage may be determined empirically or by numerical calculation. By empirical methods, introduced warpage may be optimized and tuned by systematically varying the magnitude of the constrained out-of-plane bowing in the CPA tool during an attach process, such as a stiffener attach process. The resulting warpage exhibited by the IC package at a specific temperature or range of temperatures is correlated to the magnitude of introduced warpage.

Some embodiments of the CPA tool comprise a TCB head having a curved bonding surface for introducing a predetermined warpage in the IC package during thermocompression bonding of components to the substrate, by pressing the workpiece with a non-planar bond head having curved or otherwise non-planar working surfaces, introducing a predetermined curvature to the IC package substrate and its attached components. This is in contrast to the conventional method of pressing the workpiece flat during thermocompression bonding.

According to some embodiments described herein, a predetermined warpage is introduced into a IC package at an elevated temperature during thermocompression bonding. According to some embodiments described herein, the out-of-plane curvature of the introduced warpage is calculated to counteract natural warpage that normally occurs after temperature cycling and return to room temperature.

The predetermined warpage is introduced into the IC package substrate, stiffener and other components bonded to the IC package substrate, and constraining the IC package assembly (e.g., substrate plus pre-bonded components and adhesive) in CPA tool. The CPA tool is equipped with bonding heads that have curved or otherwise non-planar work surfaces. In some embodiments, the bonding heads are TCB heads.

According to some embodiments, the introduced warpage and natural warpage are correlated, however, the magnitude of introduced opposing warpage may not equate to the magnitude of natural warpage. The magnitude of introduced warpage that effectively negates natural warpage may be determined experimentally or by computational methods. Knowledge of the magnitude of introduced warpage to counteract natural warpage may be manifested in the curvature or nonplanarity of the CPA tool bonding head work surfaces.

By way of example, a IC package is known to develop a convex warpage having a magnitude (e.g., maximum out-of-plane deflection) of 500 microns at room temperature after stiffener bonding. Accordingly, the room temperature warpage is substantially negated by introducing a concave warpage into the IC package assembly. As the concave warpage is introduced at an elevated temperature during thermocompression bonding in the CPA tool, during cooling the CTE mismatch strain will naturally try to warp the IC package in an opposing curvature. The concave warpage during curing of the adhesive bonding the stiffener of the IC package substrate counteracts the tendency of the IC package to warp in the opposite direction. The net result is that the net room temperature curvature of the IC package assembly is approximately zero.

According to some embodiments, CPA tool bonding head work surfaces have a built-in curvature or non-planarity having a prescribed geometry to introduce a warpage calculated to negate natural warpage of the workpiece after thermal cycling during a particular operation. In some embodiments, CPA tool bond heads comprise a three-point or three-line contact jig, where the workpiece is suspended form parallel edges, then pressed downward from above the workpiece by a protrusion contacting the workpiece at or near the middle.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Drawings are labeled with axes to indicate the orientation of the figure.

FIG. 1A illustrates a profile view of CPA bonding tool 100a, according to some embodiments of the disclosure.

In FIG. 1A, CPA bonding tool 100a comprises upper thermocompression bonding (TCB) head 101 and lower TCB head 102, shown disposed above and below curved workpiece 103. In the illustrated embodiment, upper TCB head 101 comprises concave curved work surface 104. Work surface 105 of lower TCB head 102 is also convex, and has a curvature that is substantially the same as that of work surface 104. Upper TCB head 101 and lower TCB head 102 comprise one or more of: steel, aluminum, copper, or brass, and/or alloys thereof.

In some embodiments, the particular shape of concave and convex work surfaces 104 and 105 has a curvature to constrain workpiece 103 into a bowed shape having a predetermined magnitude. In some embodiments, the predetermined magnitude of bowing or warpage may be used for a particular IC package type and measured warpage that occurs after a particular thermal cycle.

In some embodiments, workpiece 103 comprises a IC package assembly stack. In the illustrate embodiment of FIG. 1A, workpiece 103 comprises IC package substrate 106 and stiffener 107. In the exemplary embodiment shown in FIG. 1A, CPA bonding tool 100a is implemented as a constrained stiffener attach (CSA) tool, where the curvature workpiece 103 is constrained during the CSA process.

In some embodiments, stiffener 107 and IC package substrate 106 are compliant under stress, and follow the curvature of work surfaces 104 and 105 when pressed between upper TCB head 101 and lower TCB head 102. In some embodiments, the bonding adhesive (not shown) is cured during the temperature cycle, introducing a permanent bowing or warpage into workpiece 103.

As is shown below, CPA bonding tool 100 may be configured for attachment of other IC package components, such as integrated heat spreaders (IHS), interposers, and dies.

Figure 1B:
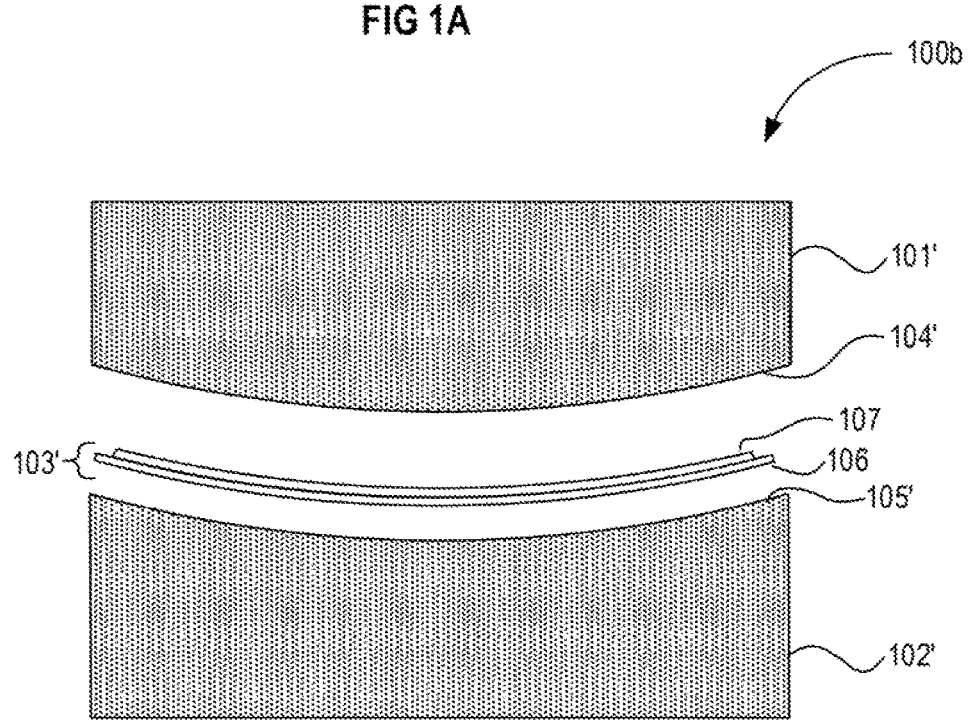
FIG. 1B illustrates a profile view of a CPA bonding tool, according to some embodiments of the disclosure.

FIG. 1B illustrates a profile view of CPA bonding tool 100b, according to some embodiments of the disclosure.

In FIG. 1B, CPA bonding tool 100b comprises upper TCB head 101' and lower TCB head 102'. TCB head 101' comprises convex work surface 104'. TCB head 102' comprises concave work surface 105'. In the illustrated embodiment, work surfaces 104' and 105' have curvature opposite that of counterpart work surfaces 104 and 105 in FIG. 1A. The curvature of workpiece 103' follows the curvature of the upper work surface 104' and lower work surface 105', bowing IC package substrate 106 and stiffener 107 into a concave warpage, as shown in FIG. 1B. The concave introduced warpage of workpiece 103' is opposite that of workpiece 103 in FIG. 1A.

The introduction of concavity or convexity to workpiece 103 (FIG. 1A) and of 103' depends on the natural warpage that is experienced by a IC package assembled by flat component attach methods. In some embodiments, workpiece 103' is bowed into a concave warpage during constrained stiffener attach (CSA). The concave introduced warpage may negate a tendency of a IC package to undergo a convex natural warpage at 260° C., experienced by a conventionally assembled IC package. Thus, the chosen constraint curvature is dependent on the direction of natural warpage to be negated by the introduced warpage, and may be optimized and tuned to negate natural warpage at any temperature. In addition, factors such as number of dies attached to the substrate, or that will be attached, final IC package thickness, may determine the amount and direction of curvature to introduce into the IC package assembly.

Figure 2:
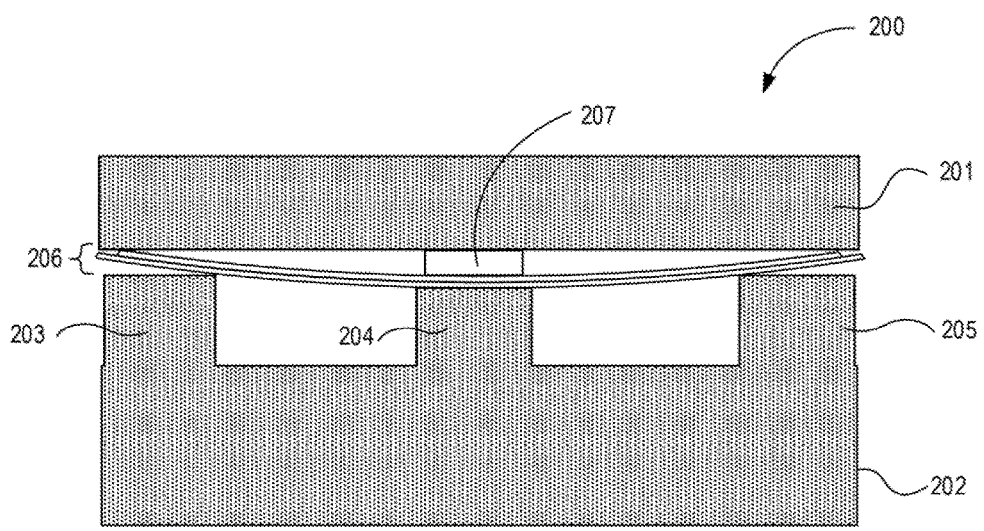
FIG. 2 illustrates a profile view of a second embodiment of a CPA tool with a three-point bending jig having a flat spacer, according to some embodiments of the disclosure.

FIG. 2 illustrates a profile view of a second embodiment of CPA tool 200 with a three-point bending jig having a flat spacer, according to some embodiments of the disclosure.

In FIG. 2, constrained IC package assembly (CPA) tool 200 comprises TCB head 201 having a flat profile, and pedestal stand 202 having three flat pedestals 203, 204 and 205. Sandwiched between pedestals 203-205 and TCB head 201 is workpiece 206, which is shown in FIG. 2 pinned between flat spacer 207 and pedestals 203-205. Pedestals 203-205 are spaced at distances commensurate with length of workpiece 206. In some embodiments, pedestals 203 and 205 are disposed under parallel edges of workpiece 206. In some embodiments, pedestals 203 and 205 are planar and have a larger z-height than center pedestal 204. The recess of center pedestal permits workpiece 206 to bow when TCB head 201 is lowered, pressing flat shim 207 against workpiece 206. In some embodiments, workpiece 206 is thus constrained in the bowed shape shown during a component attach process, and may have an introduced concave warpage corresponding to the thickness of flat spacer 207 after temperature cycling in CPA tool 200. In some embodiments, TCB heads 201 and 202 are inverted, constraining workpiece 206 into a convex bow.

In some embodiments, heat is transferred to workpiece 206 at least in part through convective modes from TCB head 201. In some embodiments, heat transfer to workpiece 206 is made at least in part by conduction through pedestals 203-205. In some embodiments, heat transfer to workpiece 206 is at least in part made by conductive mode through flat spacer 207. While TCB head 201 and pedestal stand 202 of CPA tool 200 have smaller working surface area for conductive heat transfer to workpiece 203, the distance between workpiece 203 and non-contacting heated surfaces of TCB head 201 and pedestal stand 202 is exaggerated in FIG. 2. In some embodiments, actual gap distances between workpiece 203 and non-contacting surfaces is up to 500 microns. Thus, effective convective heat transfer may be made from non-contacting surfaces to workpiece 203.

In some embodiments, flat spacer 207 is removable for interchanging with shims of different thicknesses. The magnitude of the introduced warpage may be controlled by the thickness of flat spacer 207. In some embodiments, central pedestal 204 is adjustable to accommodate adjustable magnitudes of warpage determined at least in part by flat spacer 207. In some embodiments, FIG. 3 illustrates a profile view of a third embodiment of CPA tool 300 with three-point bending jig having a round spacer, according to some embodiments of the disclosure.

Figure 3:
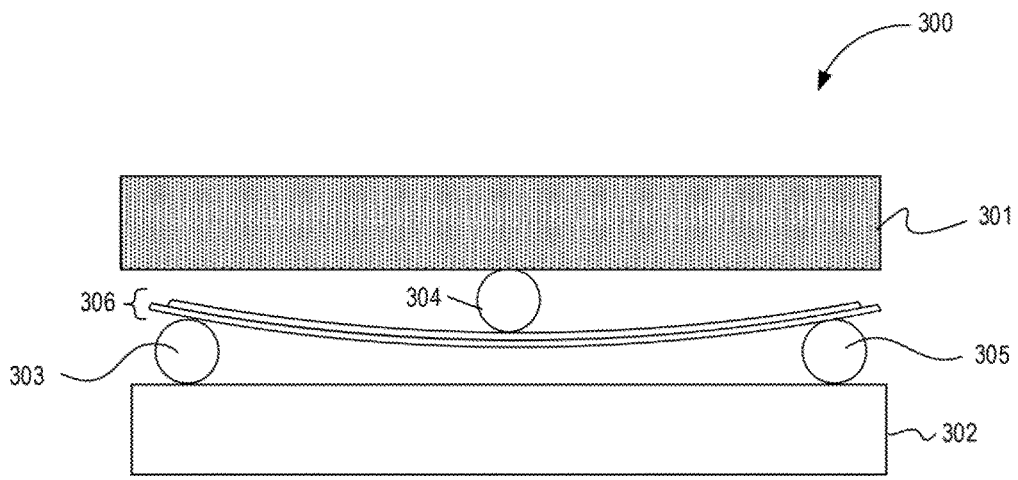
FIG. 3 illustrates a profile view of a third embodiment of CPA tool with a three-point bending jig having a round spacer, according to some embodiments of the disclosure.

In FIG. 3, CPA tool 300 comprises upper TCB head 301 and lower TCB head 302 attached round spacers 303, 304 and 305. Workpiece 306 is suspended over lower PCB head by round spacers 303 and 305, disposed underneath opposite parallel edges of workpiece 306. In some embodiments, workpiece 306 is constrained into a concave bowed shape by spacer 304 disposed near or at the middle of workpiece 306 and pressing downward. Round spacers 303-305 provide point or line contacts to workpiece 306, allowing accurate positioning. In some embodiments, round spacers 303-305 have diameters ranging up to 500 microns. In some embodiments, round spacers 303-305 are welded to TCB heads 301 and 302. In other embodiments, round spacers 303-305 are machined into the working surfaces of TCB heads 301 and 302. Round spacers 303-305 may comprise materials including, but not limited to, steel, stainless steel, copper, brass, and aluminum.

In some embodiments, heat transfer to workpiece 306 may be made by convective modes from heated upper TCB head 301, lower TCB head 302 or from both TCB heads 301 and 302. In some embodiments, distances from surfaces of the TCB heads to workpiece 306 are 500 microns or less, allowing efficient heat transfer by convective and radiative modes. In some embodiments, CPA tool 300 is placed in a heated chamber, such as an oven, to ensure uniform distribution of heat to workpiece 306.

Warpage introduced into workpiece 306 may be controlled by the diameters of round spacers 303-305. In some embodiments, TCB heads 301 and 302 are interchangeable within CPA tool 300, allowing diameters of round pacers 303-305 to be changed.

Figure 4A:
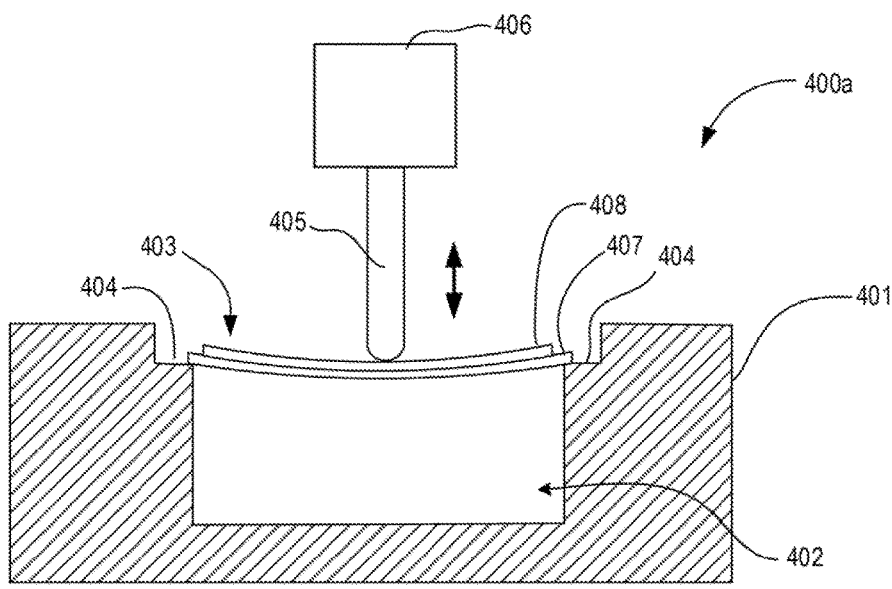
FIG. 4A illustrates a cross-sectional view of a CPA tool having an open cavity pedestal, according to some embodiments of the disclosure.

FIG. 4A illustrates a cross-sectional view of CPA tool 400a having an open cavity pedestal, according to some embodiments of the disclosure.

In FIG. 4A, CPA tool 400a comprises pedestal 401 having an open cavity 402, over which workpiece 403 is suspended without constraints. In some embodiments, workpiece 403 is suspended along opposing edges on ledges 404. Workpiece 403 is constrained between stylus 405, disposed over the center region of workpiece 403, and ledges 404 disposed at or near opposing edges of workpiece 403. In some embodiments, ledges 404 and stylus 405 provide a three-point contact clamp system to constrain workpiece 403 into a bowed shape, introducing a warpage to workpiece 403. In some embodiments, stylus 405 is attached to plunger 406, which is coupled to a drive mechanism (not shown) for raising and lowering stylus 405 away from and towards workpiece 403, as indicated by the dual arrowheads in FIG. 4A. In the illustrated embodiment, plunger 403 is abutted against workpiece 403, constraining workpiece 403 in a concave bow.

In some embodiments, workpiece 403 comprises IC package substrate 407 and stiffener 408. Warpage may be introduced during thermal cycling of a stiffener attach process, where the magnitude of warpage is set by distance IC package substrate 407 and stiffener 408 are bowed out-of-plane. In some embodiments, the magnitude of warpage is adjusted by the vertical positioning of stylus 405. Stylus 405 may abut against workpiece 403 with a predetermined amount of force to cause workpiece 403 to bow with a predetermined magnitude. In some embodiments, pedestal 401 is heated. In some embodiments, cavity 402 is less than 1 mm deep, allowing efficient heat transfer to workpiece by convective and radiative modes.

Figure 4B:
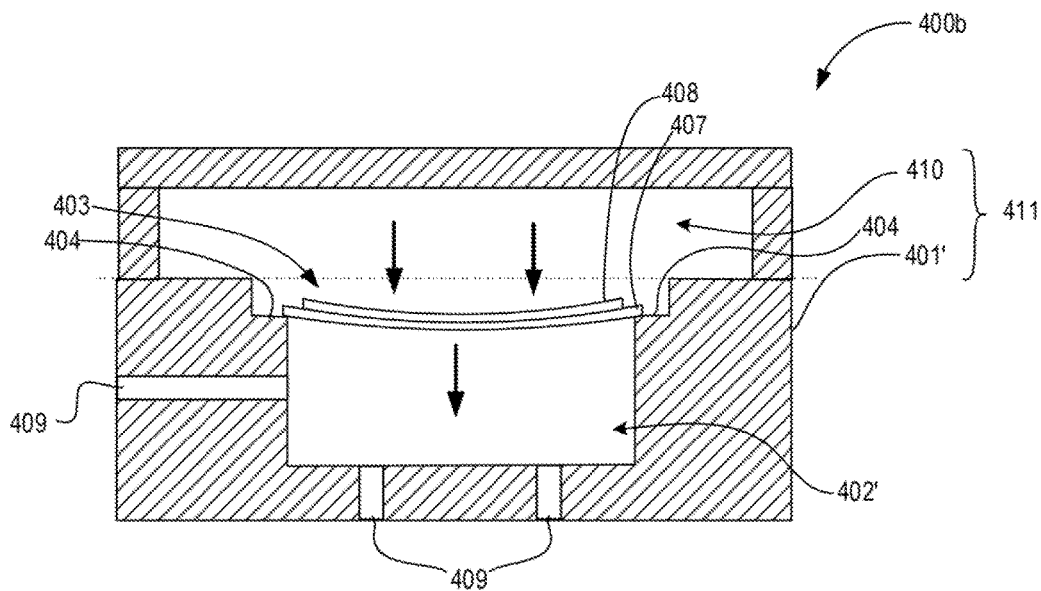
FIG. 4B illustrates a cross-sectional view of a CPA tool having an air pressure workpiece constraint system, according to some embodiments of the disclosure.

FIG. 4B illustrates a cross-sectional view of CPA tool 400b having an air pressure workpiece constraint system, according to some embodiments of the disclosure.

In FIG. 4B, CPA tool 400b comprises pedestal 401' having vacuum ports 409 opening into cavity 402'. Pedestal 401 comprises ledges 404, disposed at opposing edges of workpiece 403. In some embodiments, workpiece 403 is suspended over cavity 402'. In some embodiments, cavity 402' is a vacuum chamber. In some embodiments, cavity 402' is under vacuum, causing the atmospheric pressure below workpiece 403 to be lower than the atmospheric pressure above workpiece 403, bowing workpiece 403 to introduce a concave warpage into workpiece. 403. In the illustrate embodiment, workpiece 403 comprises IC package substrate 407 and stiffener 408. In other embodiments, workpiece 403 comprises other components, including, but not limited to, one or more dies, an integrated heat spreader, a lead frame, and an interposer.

Cavity 410 is disposed above workpiece 403, opposite cavity 402'. In some embodiments, cavity 410 is a portion of upper TCB head 411, and open at the intersection of the cavity 410 with working surface denoted by the dashed line. In some embodiments, upper TCB head 411 forms a seal when in contact with pedestal 401', and cavity 410 is separated from cavity 402' by workpiece 403, as shown in FIG. 4B. In some embodiments, cavity 410 is pressurized by introduction of pressurized gas, forming a pressure chamber. Pressurized gases include, but are not limited to, air, nitrogen, helium, and argon. Force applied to the top of workpiece 403 by pressurized gas confined within chamber 410 bows workpiece 403 into a concave shape. In some embodiments, vacuum applied to cavity 402' assists bowing of workpiece 403. Downward-pointing arrows in FIG. 4B indicate direction of applied force, both from positive pressure of the pressurized gas above workpiece 403 and from negative pressure of the vacuum applied below workpiece 403.

In some embodiments, workpiece 403 may be bowed into a convex shape by reversal of chamber pressurization. In some embodiments, cavity 410 is a vacuum chamber, and cavity 401' is pressurized. In some embodiments, workpiece 403 is clamped at opposing edges to enable IC package components to face upwards while constrained to bow when pressure is applied from below.

In some embodiments, upper TCB head 411 and pedestal 402' are heated. Heat may be transferred to workpiece 403 by convective and radiative modes. In some embodiments, chamber 410 and cavity 402' have depths not exceeding 1 mm for efficient heat transfer from chamber surfaces to workpiece 403. In some embodiments, CPA tool 400 is placed in a heated chamber, such as an oven.

Figure 5A:
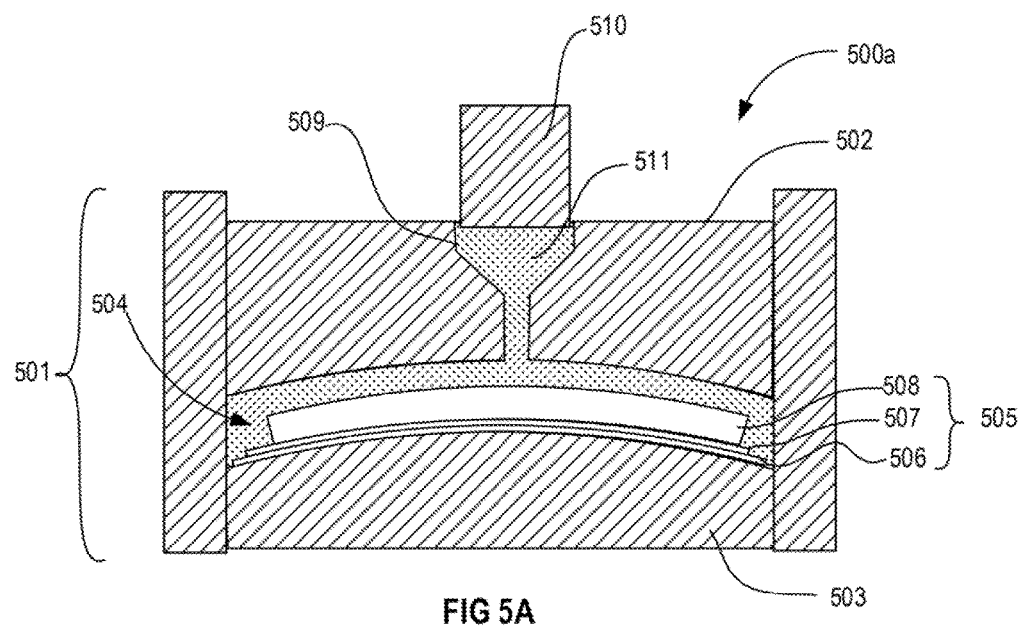
FIG. 5A illustrates a cross-sectional view of a molding tool for IC package over-mold having convex mold chases, according to some embodiments of the disclosure.

FIG. 5A illustrates a cross-sectional view of molding tool 500a for IC package over-mold having convex mold chases, according to some embodiments of the disclosure.

In FIG. 5A, CPA tool 500a comprises injection molding head 501, which comprises upper convex mold chase 502 and lower convex mold chase 503. Upper convex mold chase 502 and lower convex mold chase 503 enclose mold chamber 504, within which workpiece 505 is enclosed. Workpiece 505 comprises IC package substrate 506, stiffener 507 and die 508. Sprue 509 is disposed above mold chamber 504, and opens into mold chamber 504. Piston 510 inserts into sprue 509. During the molding of workpiece 505, molten mold compound 511 is injected under pressure into mold chamber 504 through sprue 509. Piston 510 presses on molten mold compound 511, forcing it through sprue 509 into mold chamber 504.

In some embodiments, workpiece 505 is constrained within mold chamber 504 to bow into the illustrated shape, introducing a convex warpage into workpiece 505. Upper convex mold chase 502 molds a substantially identical convex curvature into mold compound 511. The curvature of upper and lower convex mold chases 502 and 503, respectively, may be specific to counteract a known natural warpage of a particular IC package. In some embodiments, the same CPA tool 500a may be used for more than one IC package by inclusion of interchangeable upper and lower convex mold chases 502 and 503. In some embodiments, upper and lower convex mold chases 502 and 503 are removable and interchangeable with corresponding parts having different curvatures.

Figure 5B:
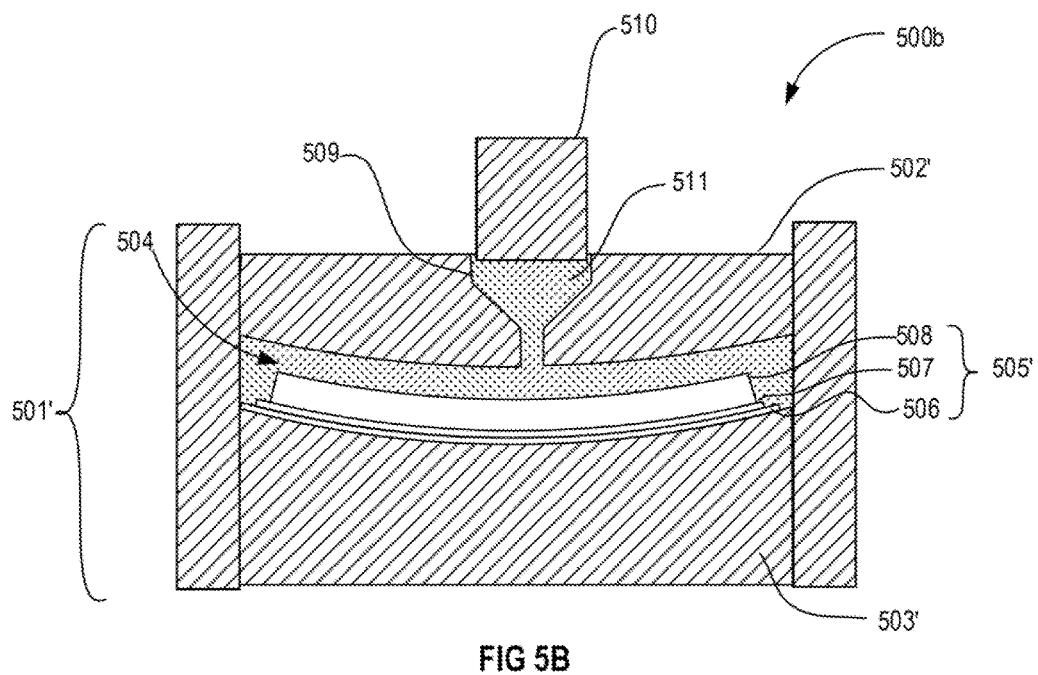
FIG. 5B illustrates a cross-sectional view of a molding tool having concave mold chases, according to some embodiments of the disclosure.

FIG. 5B illustrates a cross-sectional view of molding tool 500b having concave mold chases, according to some embodiments of the disclosure.

In FIG. 5B, CPA tool 500b comprises injection molding head 501', which comprises upper concave mold chase 502' and lower concave mold chase 503'. Upper concave mold chase 502' and lower concave mold chase 503' enclose mold chamber 504, within which workpiece 505' is enclosed. Workpiece 505' comprises IC package substrate 506, stiffener 507 and die 508. Sprue 509 is disposed above mold chamber 504, and opens into mold chamber 504. Piston 510 inserts into sprue 509. During the molding of workpiece 505, molten mold compound 511 is injected under pressure into mold chamber 504 through sprue 509. Piston 510 presses on molten mold compound 511, forcing it through sprue 509 into mold chamber 504.

In some embodiments, workpiece 505' is constrained within mold chamber 504 to bow into the illustrated shape, introducing a concave warpage into workpiece 505'. Upper concave mold chase 502' molds a substantially identical concave curvature into mold compound 511. The curvature of upper and lower concave mold chases 502' and 503', respectively, may be specific to counteract a known natural warpage of a particular IC package. In some embodiments, the same CPA tool 500b may be used for more than one IC package by inclusion of interchangeable upper and lower concave mold chases 502' and 503'. In some embodiments, upper and lower concave mold chases 502' and 503' are removable and interchangeable with corresponding parts having different curvatures.

Figure 6A:
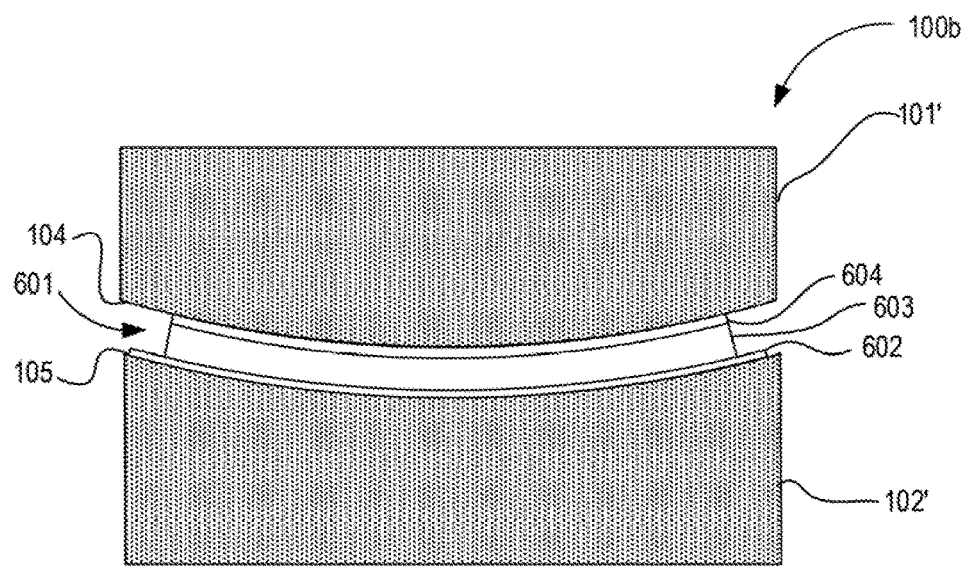
FIG. 6A illustrates a profile view of a CPA tool having concave thermocompression bonding (TCB) heads with a constrained die backside stiffener attach workpiece during a IC package assembly process, according to some embodiments of this disclosure.

FIG. 6A illustrates a profile view of CPA tool 100a having concave TCB heads with a constrained die backside stiffener attach workpiece during a IC package assembly process, according to some embodiments of this disclosure.

In FIG. 6A, CPA tool 100a comprises upper thermocompression bonding (TCB) head 101 and lower TCB head 102, shown disposed above and below workpiece 601. In the illustrated embodiment, workpiece 601 comprises IC package substrate 602, die 603 and die backside stiffener 604. In some embodiments, die 603 is solder bonded to IC package substrate 602 in an earlier solder reflow operation. In a present operation, die backside stiffener 604 is attached in the present operation. An adhesive (not shown) is applied in an earlier operation. In some embodiments, the adhesive may be in a liquid state or partially cured in the illustrated embodiment.

Workpiece 601 is abutted against work surfaces 104 and 105 by approaching upper TCB head 101 and lower TCB head 102. All components of workpiece 601 are constrained to bow into a concave curvature by compressive force imposed by upper and lower TCB heads 101 and 102. In some embodiments, upper TCB head 101 is heated. In some embodiments, lower TCB head 102 is heated. In some embodiments, both upper and lower TCB heads 101 and 102 are heated. During temperature cycling, the die backside stiffener adhesive cures and solidifies, creating a permanent concave warpage of workpiece 601.

The magnitude of the introduced concave warpage of workpiece 601 is determined by the curvature of work surfaces 104 and 105 of upper and lower TCB heads 101 and 102, respectively. The curvature of work surfaces 104 and 105 is predetermined by knowledge of the magnitude and direction of natural warpage of a particular IC package that is conventionally assembled by flat thermocompression bonding. To counteract a natural convex warpage, working surfaces 104 and 105 may be machined to have a concave curvature, the warpage at room temperature may be negated by measurement of the room temperature warpage (magnitude and direction) and determining a magnitude and direction of introduced warpage that negates or mitigates the natural warpage.

Figure 6B:
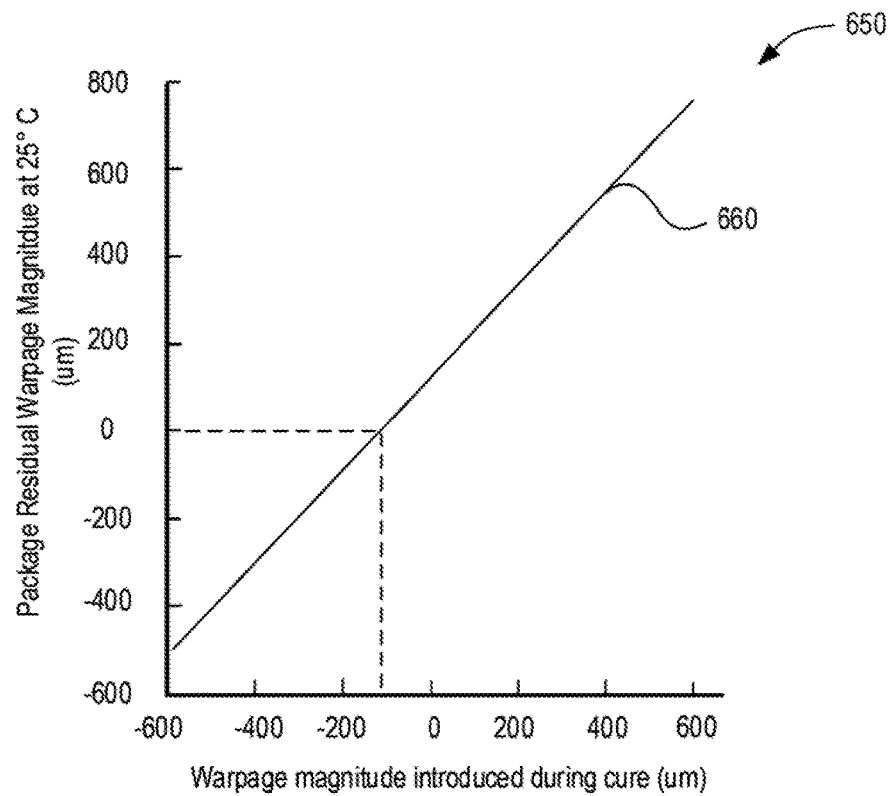
FIG. 6B illustrates an exemplary plot for correlating the magnitude of concave warpage introduced into a IC package during cure and the warpage of the IC package at 25° C., according to some embodiments of the disclosure.

FIG. 6B illustrates exemplary plot 650 for correlating the magnitude of concave warpage introduced into an IC package during cure and the warpage of the IC package at 25° C., according to some embodiments of the disclosure.

In FIG. 6B, plot 650 is determined experimentally for determining the magnitude of introduced warpage into a particular IC package during constrained IC package assembly (CPA) in order to substantially mitigate IC package warpage at 25° C. In some embodiments, curve 660 of plot 650 is fit to several experimental data points. The negative values on the axes indicate concave warpage, while the positive values indicate convex warpage. In the illustrated example, the particular IC package exhibits a natural convex warpage at room temperature (e.g., approximately 20° C. to 25° C.) after the IC package is assembled and having undergone several temperature cycling operations for component attach, including solder reflow for die attach. The magnitude and direction of natural warpage may depend on the particular materials, dimensions, moduli and CTE mismatch between attached components.

By way of example, to counteract the natural convex warpage that a finished IC package exhibits at room temperatures (e.g., 20° C. to 25° C.) if assembled in a flat geometry, a number of IC package units may be assembled by the CPA process. A correlation curve may be constructed by systematically varying the magnitudes of introduced warpage. In some embodiments, partially assembled IC package workpieces are constrained in a CPA tool with different amounts of out-of-plane bowing. The residual IC package warpage at room temperature may then be then measured. The resulting correlation plot, such as plot 650, may be used to determine the final IC package warpage at approximately 25° C., as a function of the magnitude of warpage introduced during CPA IC package assembly. As an example, if zero IC package warpage is desired at room temperature, a magnitude of warpage introduced during a constrained attach process (e.g., constrained stiffener attach) optimization procedure in the CPA tool may be identified that correlates to zero warpage at room temperature. The introduced warpage may be optimized for zero IC package warpage at any temperature. In some embodiments, the introduced warpage is optimized for zero warpage at solder reflow temperatures (e.g., 220° C. to 260° C.). is not In some embodiments, the CPA process may be performed at one particular operation in the assembly. In some embodiments, the CPA process is performed at one or more operations in the IC package assembly.

For a critical attach operation in a particular IC package assembly, Curve 660 may be used to find the residual warpage that results from thermal cycling with the workpiece constrained. After constructing plot 650, the broken lines indicate that at a concave warpage of approximately 100 microns magnitude results in a substantially flat IC package at 25° C.

Figure 7:
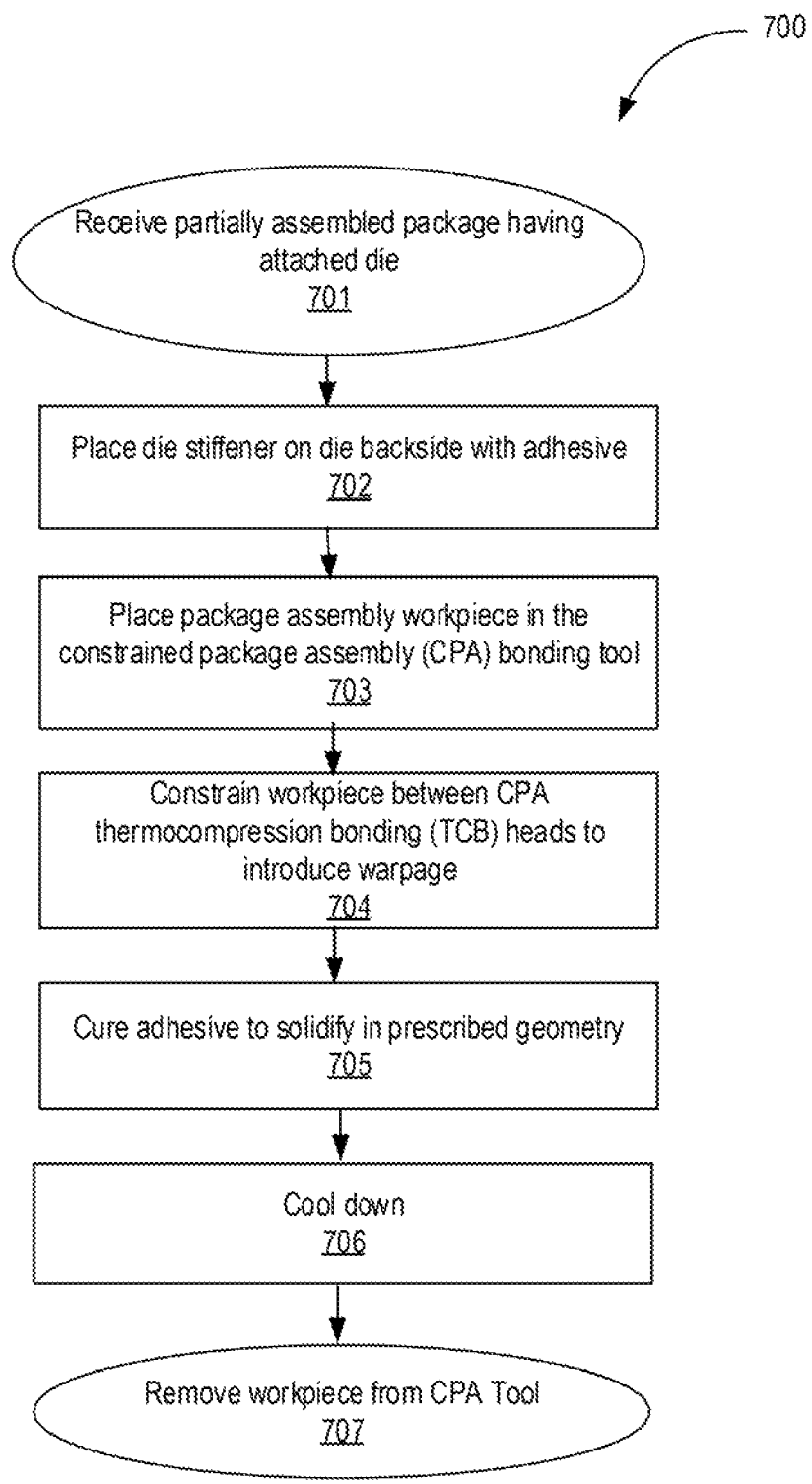
FIG. 7 illustrates a method for an exemplary CPA process embodied in a process flow chart, according to embodiments of the disclosure.

FIG. 7 illustrates a method for an exemplary constrained cure IC package assembly process embodied in flow chart 700, according to embodiments of the disclosure.

In FIG. 7, an exemplary constrained IC package assembly (CPA) process is illustrated in flow chart 700, which represents a process flow for a die backside stiffener attach process. At operation 701, a partially assembled IC package is received for stiffener attach. In some embodiments, a die (e.g., 603 in FIG. 6A) is attached to the IC package substrate (e.g. 602 in FIG. 6A).

At operation 702, the partially complete IC package may be prepared for placement of a stiffener on the die backside. In some embodiments, an adhesive is first applied to the die, then the stiffener is placed on the adhesive.

At operation 703, the partial IC package assembly is placed in the CPA bonding tool (e.g., 100 in FIG. 6A). In some embodiments, the partial IC package assembly workpiece (e.g., 601 in FIG. 6A), is placed on the lower TCB head (e.g., 102 in FIG. 6A). In some embodiments, the workpiece is placed on a pedestal of a three-point contact constrained bonding tool (e.g., 200 in FIG. 2). In some embodiments, the workpiece is placed on round spacers (e.g., 303 and 305 of FIG. 3) of a three-point contact constrained bonding tool (e.g. 300 in FIG. 3) constrained between curved TCB heads.

At operation 704, the workpiece is constrained in the CPA bonding tool. In some embodiments, the upper TCB head (e.g., 101 in FIG. 6A) is lowered toward the lower TCB head (e.g. 102 in FIG. 6A), pressing its curved work surface on the workpiece at the center of curvature of the upper TCB head. Enough force is applied to bow the workpiece against the curved work surface of the lower TCB head, introducing a concave warpage in the workpiece. In some embodiments, the TCB head (e.g. 201 in FIG. 2) is lowered toward the pedestal stand (e.g., 202) in the three-point contact constrained bonding tool (e.g., 200 in FIG. 2). Flat spacer on the TCB head presses the workpiece downward, causing it to bow downward, introducing a concave warpage. In some embodiments, upper TCB head (e.g. 301 in FIG. 3) is lowered toward lower TCB head (e.g., 302 in FIG. 3). The center round spacer (e.g., 304 in FIG. 3) presses on the workpiece from above, bowing it downward. The action introduces a concave warpage into the workpiece.

At operation 705, a thermal cycle regime is initiated, heating the workpiece to a cure temperature for the adhesive. In some embodiments, the temperature is ramped to a maximum value and held for a prescribed period of time. In other embodiments, the more than one temperature plateaus are prescribed for the particular adhesive. Due to the thermocompression bonding, the IC package assembly is permanently bowed out-of-plane into a concave (e.g., downward) or convex (e.g., upward) warped profile in at least one x-y dimension. This operation is carried out at an elevated temperature, in accordance with some embodiments. According to some embodiments, the operation is conducted at or above the cure temperature of the adhesive for a prescribed period allowing solidification of the adhesive.

At operation 706, the temperature is ramped down to room temperature. In some embodiments, the adhesive solidifies and holds the constrained geometry of the workpiece. At room temperature, a residual warpage in the IC package may be apparent. In some embodiments, the introduced warpage during the CPA operation (704) is optimized for solder reflow at 260° C. in downstream surface mount of the completed IC package to a circuit board, where the IC package is flat at solder reflow temperatures for maximizing solder bonding to the circuit board. Thus, a residual room temperature warpage of the IC package is apparent, and is tolerated in some applications because it is more critical that the IC package remain flat during surface mount soldering.

At operation 707, the workpiece is removed from the CPA tool. In some embodiments, the workpiece is removed by reversal of operations 703 and 704. While process flow 700 is optimized for a constrained die backside stiffener attach process, it may substantially apply to other IC package component attach operations. Thus, components such as substrate stiffeners, integral heat spreaders (IHS), IHS lidded packages, interposers, both picture frame and blind types, over molded packages, may be substituted for the die backside stiffener.

Figure 8:
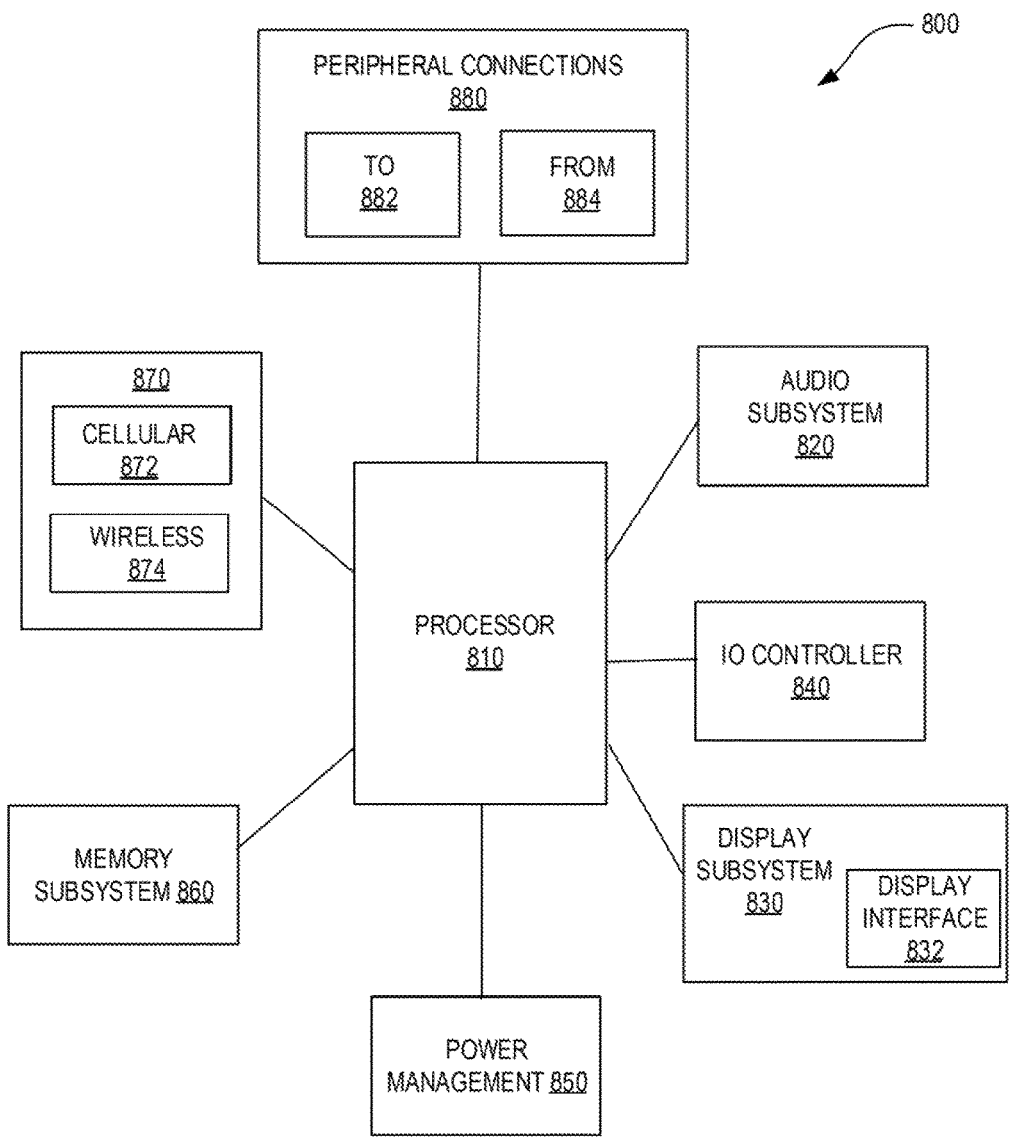
FIG. 8 illustrates a constrained cure assembled IC package connecting multiple dies as part of a system-on-chip (SoC) IC package in an implementation of computing device, according to some embodiments of the disclosure.

FIG. 8 illustrates a constrained cure assembled IC package as part of a system-on-chip (SoC) IC package in an implementation of computing device, according to some embodiments of the disclosure.

FIG. 8 illustrates a block diagram of an embodiment of a mobile device in which flat surface interface connectors could be used. In some embodiments, computing device 800 represents a mobile computing device, such as a computing tablet, a mobile phone or smart-phone, a wireless-enabled e-reader, or other wireless mobile device. It will be understood that certain components are shown generally, and not all components of such a device are shown in computing device 800.

In some embodiments, computing device 800 includes a first processor 810. The various embodiments of the present disclosure may also comprise a network interface within 870 such as a wireless interface so that a system embodiment may be incorporated into a wireless device, for example, cell phone or personal digital assistant.

In one embodiment, processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting the computing device 800 to another device. The processing operations may also include operations related to audio I/O and/or display I/O.

In one embodiment, computing device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 800, or connected to the computing device 800. In one embodiment, a user interacts with the computing device 800 by providing audio commands that are received and processed by processor 810.

Display subsystem 830 represents hardware (e.g., display devices) and software (e.g., drivers) components that provide a visual and/or tactile display for a user to interact with the computing device 800. Display subsystem 830 includes display interface 832 which includes the particular screen or hardware device used to provide a display to a user. In one embodiment, display interface 832 includes logic separate from processor 810 to perform at least some processing related to the display. In one embodiment, display subsystem 830 includes a touch screen (or touch pad) device that provides both output and input to a user.

I/O controller 840 represents hardware devices and software components related to interaction with a user. I/O controller 840 is operable to manage hardware that is part of audio subsystem 820 and/or display subsystem 830. Additionally, I/O controller 840 illustrates a connection point for additional devices that connect to computing device 800 through which a user might interact with the system. For example, devices that can be attached to the computing device 800 might include microphone devices, speaker or stereo systems, video systems or other display devices, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of the computing device 800. Additionally, audio output can be provided instead of, or in addition to display output. In another example, if display subsystem 830 includes a touch screen, the display device also acts as an input device, which can be at least partially managed by I/O controller 840. There can also be additional buttons or switches on the computing device 500 to provide I/O functions managed by I/O controller 840.

In one embodiment, I/O controller 840 manages devices such as accelerometers, cameras, light sensors or other environmental sensors, or other hardware that can be included in the computing device 800. The input can be part of direct user interaction, as well as providing environmental input to the system to influence its operations (such as filtering for noise, adjusting displays for brightness detection, applying a flash for a camera, or other features).

In one embodiment, computing device 800 includes power management 850 that manages battery power usage, charging of the battery, and features related to power saving operation. Memory subsystem 860 includes memory devices for storing information in computing device 800. Memory can include nonvolatile (state does not change if power to the memory device is interrupted) and/or volatile (state is indeterminate if power to the memory device is interrupted) memory devices. Memory subsystem 860 can store application data, user data, music, photos, documents, or other data, as well as system data (whether long-term or temporary) related to the execution of the applications and functions of the computing device 800.

Elements of embodiments are also provided as a machine-readable medium (e.g., memory 860) for storing the computer-executable instructions. The machine-readable medium (e.g., memory 860) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 870 includes hardware devices (e.g., wireless and/or wired connectors and communication hardware) and software components (e.g., drivers, protocol stacks) to enable the computing device 800 to communicate with external devices. The computing device 800 could be separate devices, such as other computing devices, wireless access points or base stations, as well as peripherals such as headsets, printers, or other devices.

Network interface 870 can include multiple different types of connectivity. To generalize, the computing device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 874 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 880 include hardware interfaces and connectors, as well as software components (e.g., drivers, protocol stacks) to make peripheral connections. It will be understood that the computing device 800 could both be a peripheral device ("to" 882) to other computing devices, as well as have peripheral devices ("from" 884) connected to it. The computing device 800 commonly has a "docking" connector to connect to other computing devices for purposes such as managing (e.g., downloading and/or uploading, changing, synchronizing) content on computing device 800. Additionally, a docking connector can allow computing device 800 to connect to certain peripherals that allow the computing device 800 to control content output, for example, to audiovisual or other systems.

In addition to a proprietary docking connector or other proprietary connection hardware, the computing device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus, comprising a first platform comprising a first working surface having a first non-planar portion, and a second platform comprising a second working surface having a second non-planar portion, wherein the second working surface is opposite the first working surface, a distance between the first working surface and the second working surface is adjustable, the first non-planar portion comprises a protruding portion, and the second non-planar portion comprises a recessed portion opposite the protruding portion.

Example 2 includes all of the features of example 1, wherein the first non-planar portion comprises a first curved portion extending from the first platform.

Example 3 includes all of the features of example 2, wherein the second non-planar portion comprises a second curved portion recessed into the second platform, wherein the second curved portion is opposite the first curved portion, and wherein the curvature of the second curved portion is substantially the same as the curvature of the first curved portion.

Example 4 includes all of the features of example 1, wherein the second non-planar portion comprises three protrusions comprising a middle protrusion equidistant between two peripheral protrusions, and wherein a z-height of the two peripheral protrusions is larger than z-height of the middle protrusion.

Example 5 includes all of the features of example 4, wherein the first non-planar portion comprises one protrusion opposite the middle protrusion of the second non-planar portion.

Example 6 includes all of the features of example 1, wherein the second non-planar portion comprises two protrusions separated by a recessed portion of the second non-planar portion.

Example 7 includes all of the features of example 6, wherein the first non-planar portion comprises a protrusion opposite the recessed portion of the second non-planar portion.

Example 8 includes all of the features of example 1, wherein the first platform is a pedestal that comprises a first cavity.

Example 9 includes all the features of example 8, wherein the first platform comprises a protrusion extending from the first non-planar portion opposite the first cavity of the pedestal.

Example 10 includes all of the features of example 8, wherein the pedestal comprises ports extending from the exterior to the first cavity.

Example 11 includes all of the features of example 10, wherein the ports are vacuum ports.

Example 12 includes all of the features of example 8, wherein the second platform comprises a second cavity opposite the first cavity of the pedestal.

Example 13 includes all of the features of example 12, wherein the second cavity is a pressure chamber.

Example 14 includes all of the features of example 1, wherein the first platform is a thermocompression bond head.

Example 15 includes all of the features of example 1, wherein the second platform is a thermocompression bonding head.

Example 16 is a method comprising receiving a partially assembled IC package comprising an IC package substrate, placing an adhesive over the IC package substrate, attaching a IC package component on the adhesive, warping the partially assembled IC package out-of-plane, and curing the adhesive.

Example 17 includes all of the features of example 16, wherein warping the partially assembled IC package out-of-plane comprises introducing a predetermined curvature in the partially assembled IC package.

Example 18 includes all of the features of example 17, wherein introducing a predetermined curvature in the partially assembled IC package comprises constraining the partially assembled IC package between non-planar working surfaces.

Example 19 includes all of the features of example 17, wherein warping the partially assembled IC package out-of-plane comprises constraining the partially assembled IC package between opposing thermocompression bonding heads having non-planar working surfaces.

Example 18 includes all of the features of example 16, wherein warping the partially assembled IC package out-of-plane comprises introducing a predetermined curvature in the partially assembled IC package.

Example 19 includes all of the features of example 17, wherein introducing a predetermined curvature in the partially assembled IC package comprises constraining the partially assembled IC package between opposing thermocompression bonding heads having non-planar working surfaces.

Example 20 includes all of the features of example 19, wherein the non-planar working surfaces of the opposing thermocompression bonding heads comprise opposing curved portions having substantially a same curvature.

Example 21 includes all of the features of examples 19 or 20, constraining the partially assembled IC package between the non-planar work surfaces of the opposing thermocompression bonding heads comprise suspending the IC package substrate between two pedestals of a lower thermocompression bonding head and pressing on the partially assembled IC package by a protrusion extending from the working surface of an upper thermocompression bonding head.

Example 22 includes all of the features of examples 17 or 18, wherein introducing a predetermined curvature in the partially assembled IC package comprises suspending the partially assembled IC package over a cavity and applying a vacuum in the cavity.

Example 23 includes all of the features of examples 17 or 18, wherein introducing a predetermined curvature in the partially assembled IC package comprises suspending the partially assembled IC package under a chamber and applying pressure over the partially assembled IC package.

Example 24 includes all of the features of any one of examples 17 through 23, wherein introducing a predetermined curvature in the partially assembled IC package comprises determining an optimal magnitude of warpage to introduce into the partially assembled IC package by constraining the partially assembled IC package between non-planar working surfaces. by correlating a magnitude of warpage at a temperature of a IC package comprising the partially assembled IC package with a magnitude of warpage introduced into the partially assembled IC package.

Example 25 includes all of the features of example 16, wherein curing the adhesive comprises solidifying the adhesive at an elevated curing temperature to induce a warpage in the partially assembled IC package at or above a curing temperature of the adhesive.

Example 26 is a system comprising a memory, a processor coupled to the memory, wherein the memory and processor are integrated into a IC package comprising a substrate having a first surface and an opposing second surface, one or more dies attached to the first surface of the substrate, wherein the first surface of the substrate and at least one of the one or more dies are warped at a specified temperature, and a wireless interface communicatively coupled to the IC package, the wireless interface to allow the processor to communicate with another device.

Example 27 includes all of the features of example 26, wherein the IC package comprises a thin stiffener.

Example 28 includes all of the features of examples 26 or 27, wherein the IC package has a zero warpage at a specified temperature.

Example 29 includes all of the features of example 26, wherein the specified temperature is one of approximately 20° C. or approximately 260° C.

Example 30 includes all of the features of example 26, wherein the specified temperature ranges between 20° C. and 260° C.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus, comprising:
a first platform comprising a first working surface having a first non-planar portion, wherein the first non-planar portion comprises a first curved portion extending from the first platform; and
a second platform comprising a second working surface having a second non-planar portion, wherein the second non-planar portion comprises a second curved portion recessed into the second platform, wherein the second curved portion is opposite the first curved portion, and wherein the curvature of the second curved portion is substantially the same as the curvature of the first curved portion, and wherein:
the second working surface is opposite the first working surface,
a distance between the first working surface and the second working surface is adjustable,
the first non-planar portion comprises a protruding portion; and
the second non-planar portion comprises a recessed portion opposite the protruding portion.

2. The apparatus of claim 1, wherein the first platform comprises a first thermocompression bonding head.

3. The apparatus of claim 2, wherein the second platform comprises a second thermocompression bonding head opposing the first thermocompression bonding head.

4. The apparatus of claim 3, wherein the second thermocompression bonding head has a second curved working surface, and wherein the second curved working surface has a curvature that is complimentary to a curvature of the first curved working surface.

5. The apparatus of claim 2, wherein the first thermocompression bonding head has a first curved working surface.

6. An apparatus, comprising:
a first platform comprising a first working surface having a first non-planar portion; and
a second platform comprising a second working surface having a second non-planar portion, wherein:
the second working surface is opposite the first working surface,
a distance between the first working surface and the second working surface is adjustable,
the first non-planar portion comprises a protruding portion, and
the second non-planar portion comprises a recessed portion opposite the protruding portion, wherein the second non-planar portion comprises three protrusions comprising a middle protrusion equidistant between two peripheral protrusions, and wherein a z-height of the two peripheral protrusions is larger than a z-height of the middle protrusion.

7. The apparatus of claim 6, wherein the first non-planar portion comprises one protrusion opposite the middle protrusion of the second non-planar portion.

8. The apparatus of claim 6, wherein the second non-planar portion comprises two protrusions separated by a recessed portion of the second non-planar portion.

9. The apparatus of claim 8, wherein the first non-planar portion comprises a protrusion opposite the recessed portion of the second non-planar portion.

10. An apparatus, comprising:
a first platform comprising a first working surface having a first non-planar portion; and
a second platform comprising a second working surface having a second non-planar portion, wherein:
the second working surface is opposite the first working surface,
a distance between the first working surface and the second working surface is adjustable,
the first non-planar portion comprises a protruding portion, and
the second non-planar portion comprises a recessed portion opposite the protruding portion, wherein the first platform comprises a first cavity, and wherein the first platform comprises ports extending from an exterior wall of the first platform to the first cavity.

11. The apparatus of claim 10, wherein the second platform comprises a protrusion extending from the second non-planar portion opposite the first cavity of the first platform.

12. The apparatus of claim 11, wherein the protrusion is a stylus.

13. The apparatus of claim 10, wherein the second platform comprises a second cavity opposite the first cavity of the first platform.

14. The apparatus of claim 13, wherein the second cavity is a pressure chamber.

15. The apparatus of claim 10, wherein the ports are vacuum ports.

* * * * *